US010277227B2

(12) United States Patent
Sue et al.

(10) Patent No.: US 10,277,227 B2
(45) Date of Patent: Apr. 30, 2019

(54) SEMICONDUCTOR DEVICE LAYOUT

(71) Applicant: Taiwan Semiconductor Manufacturing Company Limited, Hsinchu (TW)

(72) Inventors: Pin-Dai Sue, Hsinchu (TW); Ting-Wei Chiang, New Taipei (TW); Hui-Zhong Zhuang, Kaohsiung (TW); Li-Chun Tien, Tainan (TW); Shun-Li Chen, Tainan (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 15/367,513

(22) Filed: Dec. 2, 2016

(65) Prior Publication Data

US 2017/0346490 A1 Nov. 30, 2017

Related U.S. Application Data

(60) Provisional application No. 62/343,248, filed on May 31, 2016.

(51) Int. Cl.
*H03K 19/0948* (2006.01)
*H03K 19/20* (2006.01)
*H01L 29/78* (2006.01)
*H01L 29/66* (2006.01)
*H01L 29/06* (2006.01)
*H01L 23/535* (2006.01)
*H01L 21/768* (2006.01)
*H03K 19/21* (2006.01)

(52) U.S. Cl.
CPC ... *H03K 19/0948* (2013.01); *H01L 21/76895* (2013.01); *H01L 23/535* (2013.01); *H01L 29/0649* (2013.01); *H01L 29/66795* (2013.01); *H01L 29/785* (2013.01); *H03K 19/21* (2013.01)

(58) Field of Classification Search
None
See application file for complete search history.

(56) References Cited

U.S. PATENT DOCUMENTS 6,407,434 B1 * 6/2002 Rostoker ............. G06F 17/5072
257/207
6,452,778 B1 * 9/2002 Leung ................. H01L 23/5223
257/E27.048

(Continued)

*Primary Examiner* — Crystal L Hammond
(74) *Attorney, Agent, or Firm* — Jones Day

(57) ABSTRACT

A semiconductor device, comprising at least one active region; at least one MD region formed over a portion of the at least one active region; and at least one gate electrode formed over a portion of the at least one active region different than the portion of the active region where the MD region is formed. The semiconductor device further comprises at least one metal layer over at least a portion of the at least one active region, the at least one metal layer being located on a layer of the semiconductor device, different than the layers on which the at least one MD region and at least one gate electrode are formed. A via is formed over the at least one active region and configured to connect one of the at least one gate electrodes to one of the at least one metal layers. The at least one metal layer is configured to enable the at least one gate electrode to be connected to another at least one electrode and/or at least one MD region.

20 Claims, 9 Drawing Sheets

(56) References Cited

U.S. PATENT DOCUMENTS

| | | | |
|---|---|---|---|
| 6,476,459 B2* | 11/2002 | Lee | H01L 23/5223 257/503 |
| 9,093,575 B2* | 7/2015 | Yokoyama | H01L 31/0224 |
| 9,698,179 B2* | 7/2017 | Smith | H01L 27/13 |
| 2005/0250322 A1* | 11/2005 | Aida | H01L 29/0634 438/672 |
| 2006/0091423 A1* | 5/2006 | Poechmueller | H01L 21/31053 257/206 |
| 2007/0252258 A1* | 11/2007 | Shimada | H01L 27/0203 257/678 |
| 2008/0001192 A1* | 1/2008 | Inoue | H01L 27/14603 257/291 |
| 2008/0037179 A1* | 2/2008 | Ito | G11C 11/16 360/313 |
| 2008/0096334 A1* | 4/2008 | Kobayashi | H01L 21/823412 438/157 |
| 2010/0237420 A1* | 9/2010 | Jang | H01L 29/0692 257/368 |
| 2012/0037996 A1* | 2/2012 | Schultz | H01L 21/76895 257/368 |
| 2013/0027083 A1* | 1/2013 | Ando | H01L 27/0207 326/102 |
| 2014/0077305 A1* | 3/2014 | Pethe | H01L 21/76895 257/368 |
| 2015/0179571 A1* | 6/2015 | Pu | H01L 21/76879 257/751 |
| 2016/0035755 A1* | 2/2016 | Li | H01L 27/1225 257/40 |
| 2016/0071582 A1* | 3/2016 | Chung | G11C 11/1675 365/96 |
| 2016/0268244 A1* | 9/2016 | Young | H01L 27/0207 |
| 2016/0300754 A1* | 10/2016 | Civay | H01L 21/76897 |
| 2016/0351490 A1* | 12/2016 | Gupta | H01L 23/528 |
| 2017/0033102 A1* | 2/2017 | Kim | H01L 27/0207 |
| 2017/0040354 A1* | 2/2017 | Smith | H01L 27/13 |
| 2017/0084625 A1* | 3/2017 | Takeuchi | H01L 29/7851 |
| 2017/0092638 A1* | 3/2017 | Jung | H01L 27/0292 |
| 2017/0194433 A1* | 7/2017 | Kang | H01L 29/0696 |
| 2017/0278752 A1* | 9/2017 | Ryckaert | H01L 21/31144 |
| 2017/0345750 A1* | 11/2017 | Tsuboi | H01L 21/823878 |

* cited by examiner

SEMICONDUCTOR DEVICE LAYOUT

CROSS REFERENCE TO RELATED APPLICATIONS

This application claims priority to U.S. Provisional Application No. 62/343,248, filed May 31, 2016, entitled "Transmission Gate Layout," which is incorporated herein by reference in its entirety.

TECHNICAL FIELD

This relates to semiconductor devices and more particularly to the layout of semiconductor devices such as FinFETs (Fin Field Effect Transistors) and transmission gate circuits.

BACKGROUND

In semiconductor device layout design, there may be design rules that may restrict the design choices a designer can make. These design rules may limit the space available to a designer to place certain components and may prevent a designer from effectively utilizing certain portions of the semiconductor device that the designer may otherwise utilize. For example, certain spacing restrictions may cause semiconductor devices to be larger than they would be if the spacing restrictions were less restrictive.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
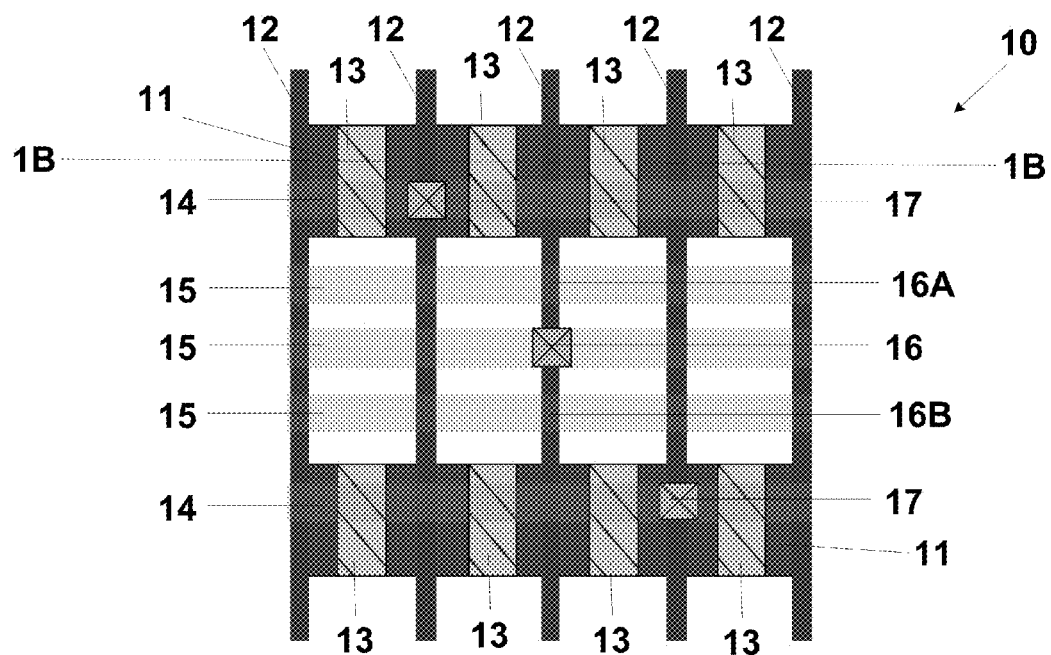
FIGS. 1A and 1B are schematic drawings illustrating an example of a semiconductor device layout that is subject to less restrictive spacing rules, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure, in various embodiments, provides a semiconductor device layout that may address one or more disadvantages of existing layout restrictions.

The disclosure provides a novel semiconductor device layout in which the design rules allow a via (e.g., a VIA_Gate (VG)) to be positioned over an active region (sometimes referred to as an OD (oxide diffusion) region). In certain embodiments, the ability to place a via over the active region may be facilitated by placing an isolation/dielectric layer 85 on top of the MD (metal over oxide) regions 13 in FIG. 1. In other words, in the semiconductor device layouts described herein, there may be no lateral spacing between a via and the active region. As described herein, in certain embodiments, the lack of a lateral spacing rule requiring a minimum via-to-active-region distance may allow for additional flexibility in the semiconductor device layout. For example, designers can more freely utilize the metal regions within the semiconductor device.

As used throughout the specification, the term semiconductor device should be understood to encompass numerous different types of circuits and device, including for example, FinFETs and/or transmission gate circuits. Additionally, the term transmission gate circuit, as used herein, may include a transmission gate circuit itself or more complex circuit designs utilizing a transmission gate as a building block for the more complex design.

Generally, semiconductor devices include a gate electrode, a source region and a drain region. In the case of a FinFET device, the FinFET includes a plurality of fins and a gate electrode. Each of the fins may have a first and a second source/drain (S/D) region and a channel region located there between. The gate electrode may surround the channel regions.

Figure 1B:
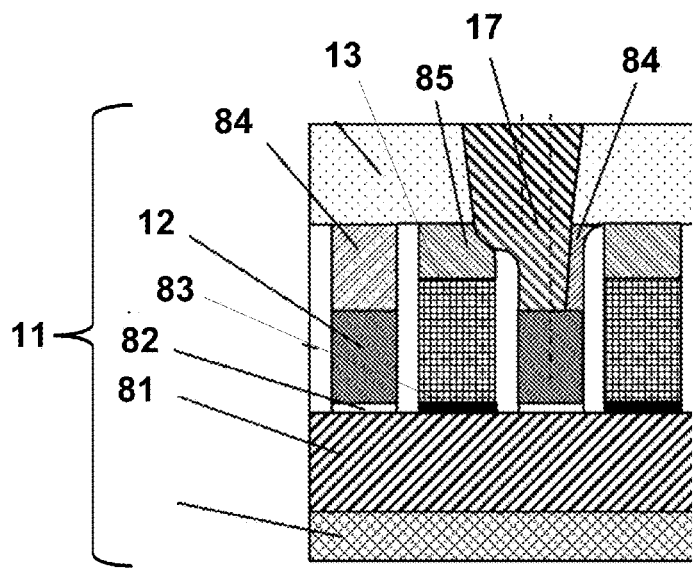

FIGS. 1A and 1B are schematic drawings illustrating an example of a semiconductor device layout that is subject to less restrictive spacing rules, in accordance with some embodiments. The semiconductor device layout in FIG. 1A and FIG. 1B illustrate an exemplary layout for a FinFET device 10. FIG. 1A is a top view of the semiconductor device and FIG. 1B is a cross-sectional view of the device illustrated in FIG. 1A taken at line 1B-1B and illustrating adjoining components around via 17. As illustrated, the device 10 may include one or more active regions 11. In FIG. 1A, the device 10 includes two active regions 11. In certain embodiments, there may be 1, 2, 3, 4, etc. active regions 11. As illustrated in FIG. 1B, FinFET device 10 may include fins 81 that extend horizontally along the length of the active region 11. The FinFET device 10 may include one or more gate electrodes 12 disposed along a vertical length of the fin 81 and source and drain regions 83 may be located in an alternating fashion between the gate electrodes 12 and within the active region 11 (see FIG. 1B). As shown in FIG. 1B, the gate electrodes 12 (i.e., the metal gate electrode) are positioned on top of a gate dielectric 82. As further illustrated, positioned above the gate electrodes 12 are gate cap insulating layers 84, and positioned above the source and drain regions 83 are source and drain conductive layers (MD layers) 13 and source and drain insulating layers 85. As further illustrated in FIG. 1B, the via 17 (e.g., a gate contact layer) can be formed over (or partly over) the gate electrode 12. But, if the via 17 is not vertically aligned with the gate electrode 12 with sufficient precision, the via 17 may extend into other regions. In particular, as illustrated in FIG. 1B, the region occupied by the source or drain 83 and MD region 13 is adjacent to the gate electrode 12. In this case, the insulating layer 85 protects the source or drain 83 and associated MD region 13 from inadvertently contacting the via 17 and causing a short circuit. In some embodiments, a short circuit is not an issue for vias 16 that are not located over active regions 11 because the source and drain 83 and MD region do not extend past the active region 11. However, the ability to place a via 17 over the active region 11 may not be possible without placing an isolation/dielectric layer 84, 85 on top of the gate electrode 12 and/or MD regions 13, as illustrated in FIG. 1B.

The FinFET device 10 may further include a plurality of conductive regions. The conductive regions may include one or more regions referred to as MD (metal over oxide) regions 13 that are configured to interconnect the S/D regions of the fin. The MD regions generally extend in substantially the same (substantially vertical) direction as the gate electrodes 12. In certain embodiments, the MD regions 13 may constitute a silicide above the S/D region and a metal (e.g., cobalt) above the silicide. The conductive regions may also include one or more metal regions 14, 15 (commonly referred to as M1 regions). Metal regions 14, 15 are metal layers located on a different layer (e.g., above) than the fins and/or gate electrodes 12. The metal regions 14, 15 may extend in a different (substantially horizontal) direction than the gate electrodes 12 and MD regions 13.

Within the FinFET device 10, the gate electrodes 12, MD regions 13, and metal regions 14, 15 are located on one or more layers of the semiconductor device and may be used to interconnect different portions of the FinFET device 10. As will be described in more detail below, the interconnections may be achieved using one or more vias.

As illustrated in FIG. 1A, certain metal regions 14 may be positioned above an active region 11 and certain metal regions 15 may be located a predetermined lateral distance from the active regions 11. The FinFET device 10 may further include at least one via 16, 17. In the example illustrated in FIG. 1A, a via 16 connects a gate electrode 12 to a metal region 15 and a via 17 connects a different gate electrode 12 to a metal region 14. Because the vias 16, 17 are used to make a connection with a corresponding gate electrode, the via may be referred to as a gate via (or, alternatively VIA_Gate, or VG).

In a situation where there is a spacing rule requiring a minimum via-to-active-region lateral spacing, the application of a via directly over an active region may be prohibited. Accordingly, via 16 illustrated in FIG. 1 may be permissible but via 17 may not be permissible. As a result, via 16 cannot connect gate electrodes 12 to metal regions 14. Further, in this example illustrated in FIG. 1, there are three positions 16, 16A, 16B where a via can be located for the gate electrode, which correspond to the intersection of the gate electrode 12 with the three metal regions 15 located outside of the active regions 11. However, when there is no minimum via-to-active-region lateral spacing requirement, a via 17 may be positioned over the active regions 11. Accordingly, as illustrated in FIG. 1, via 17 can be positioned over the active region 11 to connect gate electrodes 12 to metal regions 14. As a result, there are five positions (16, 16A, 16B, and 17) where a via can be located for each gate electrode 12, which correspond to the intersection of the gate electrode 12 with each of the three metal regions 15 located outside of the active regions 11 and both of the active regions 14 located within the active regions 11. As a result, the possible layouts for the FinFET device 10 in FIG. 1 are more flexible than the layout would have otherwise been.

In certain embodiments, the ability to place a via 17 over an active region 11 may be facilitated by placing an isolation/dielectric layer 85 on top of the MD regions 13. In this manner a short between the via 17 and the MD region 13 may be avoided.

Figure 2:
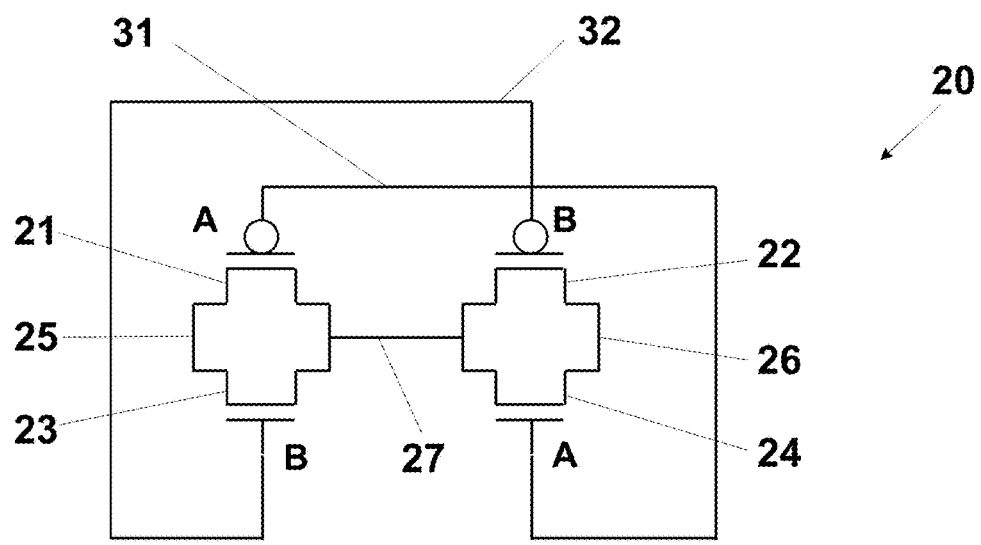
FIG. 2 is a schematic drawing of an example of a transmission gate circuit, provided to aid with the understanding of the embodiments described herein, in accordance with some embodiments.

As described above, one example of a semiconductor device that may be implemented using the novel layout described herein is a transmission gate circuit. FIG. 2 is a schematic drawing of an example of a transmission gate circuit, provided to aid with the understanding of the embodiments described herein. As illustrated, the transmission gate circuit 20 comprises PMOS transistors 21, 22 and NMOS transistors 23, 24. In general, the transmission gate circuit comprises a PMOS and an NMOS (e.g., 21, 23) coupled together in parallel and controlled by complementary signals A, B applied to their respective gates. In FIG. 2 there are two transmission gate circuits coupled together to form the more complex transmission gate circuit 20. The transmission gate circuit 20 shown in FIG. 2 is a logical XOR circuit. The gate of PMOS 21 is coupled to the gate of NMOS 24 and the gate of NMOS 23 is coupled to the gate of PMOS 22.

During operation the XOR circuit performs a logical XOR operation with respect to the gate inputs (A, B) and the inputs 25 and 26 which, like A and B, are logical complements of one another. As a result, the output 27 is the XOR logical operation of A and 25. For example, if A is a logical LOW value and 25 is a logical LOW value, their compliments B and 26 are both logical HIGH values. When voltages A, B are applied to the gates of the transistors PMOS 21 turns ON, and NMOS 23 turns ON. Accordingly, the logical value at 25 passes to 27. PMOS 22 and NMOS 24 are OFF so the value at 26 is not allowed to pass to 27. Accordingly, the output 27 is LOW. However, if A is a logical HIGH value and 25 is a logical LOW value, PMOS 21 and NMOS 23 are both OFF and PMOS 22 and NMOS 24 are both ON. Therefore, the value at 27 is a logical HIGH value.

Figure 3:
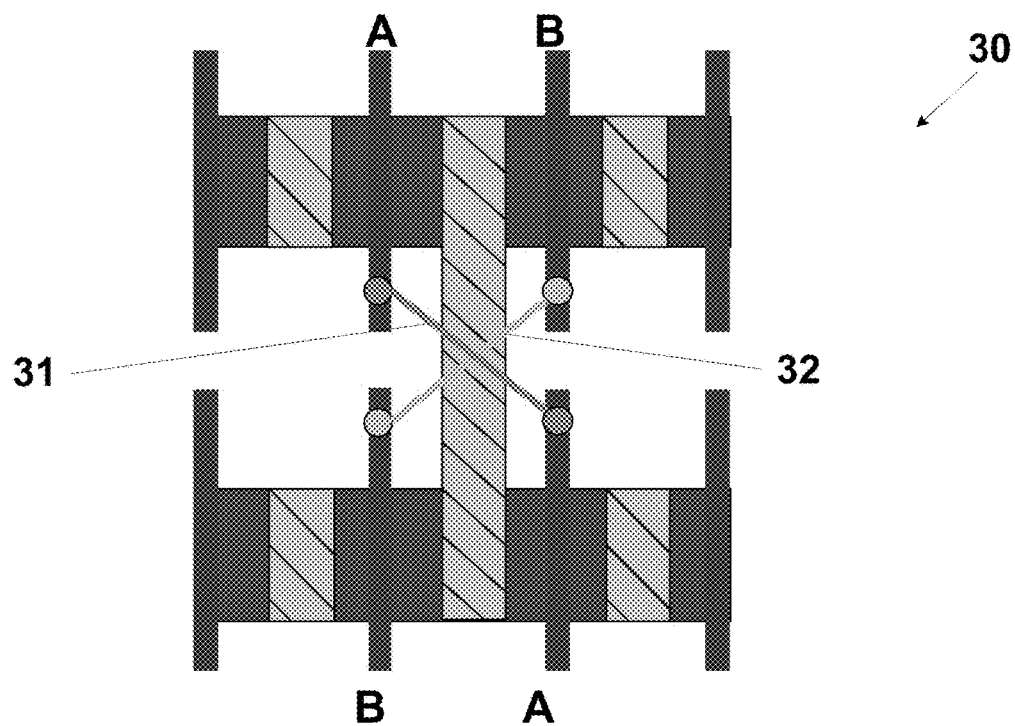
FIG. 3 is a schematic drawing of an example of a logical representation of a semiconductor device layout for the transmission gate circuit shown in FIG. 2, in accordance with some embodiments.

FIG. 3 is a schematic drawing of an example of a logical representation of a semiconductor device layout for the transmission gate circuit shown in FIG. 2. FIG. 3 is an example of a FinFET transmission gate circuit 30 in which a connection 31 (shown in FIG. 2 and FIG. 3) couples gate electrodes A together and a connection 32 (shown in FIG. 2 and FIG. 3) couples gate electrodes B together. FIG. 3 does not necessarily illustrate the actual transmission gate circuit layout but is provided to illustrate the functional connection made in such layouts.

Figure 4:
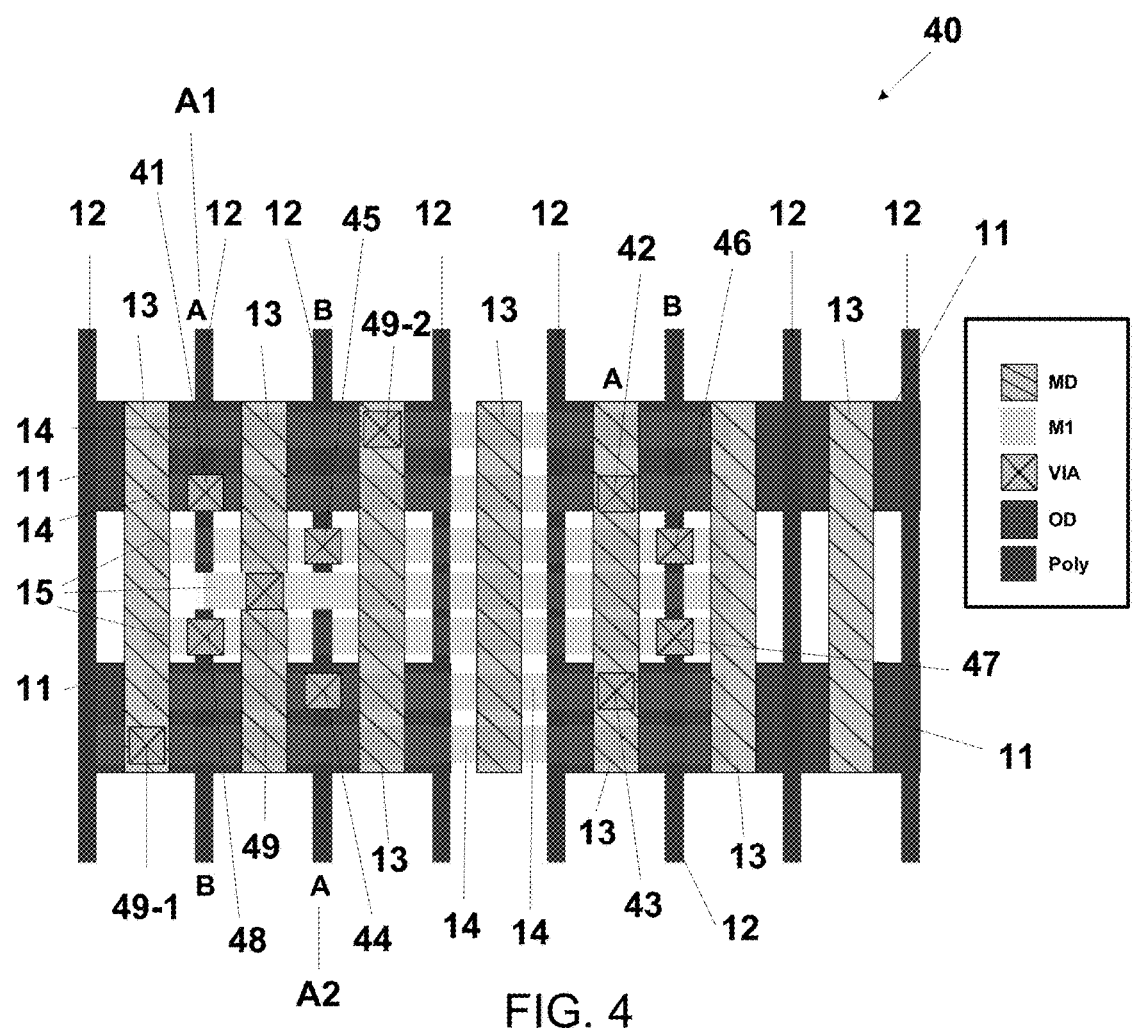
FIG. 4 is a schematic drawing of an example of a semiconductor device layout for the transmission gate circuit shown in FIG. 2 that is subject to less restrictive spacing rules, in accordance with some embodiments.
Figure 5:
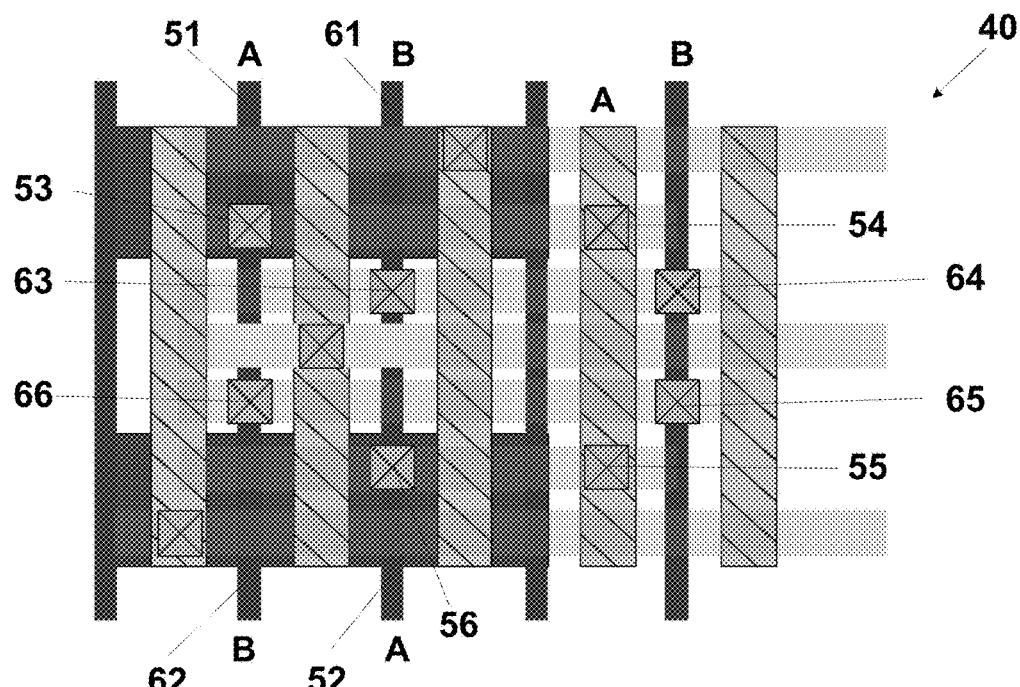
FIGS. 5-14 are schematic drawings of other examples of semiconductor device layouts for the transmission gate circuit shown in FIG. 2 that are subject to less restrictive spacing rules, in accordance with some embodiments.
Figure 6:
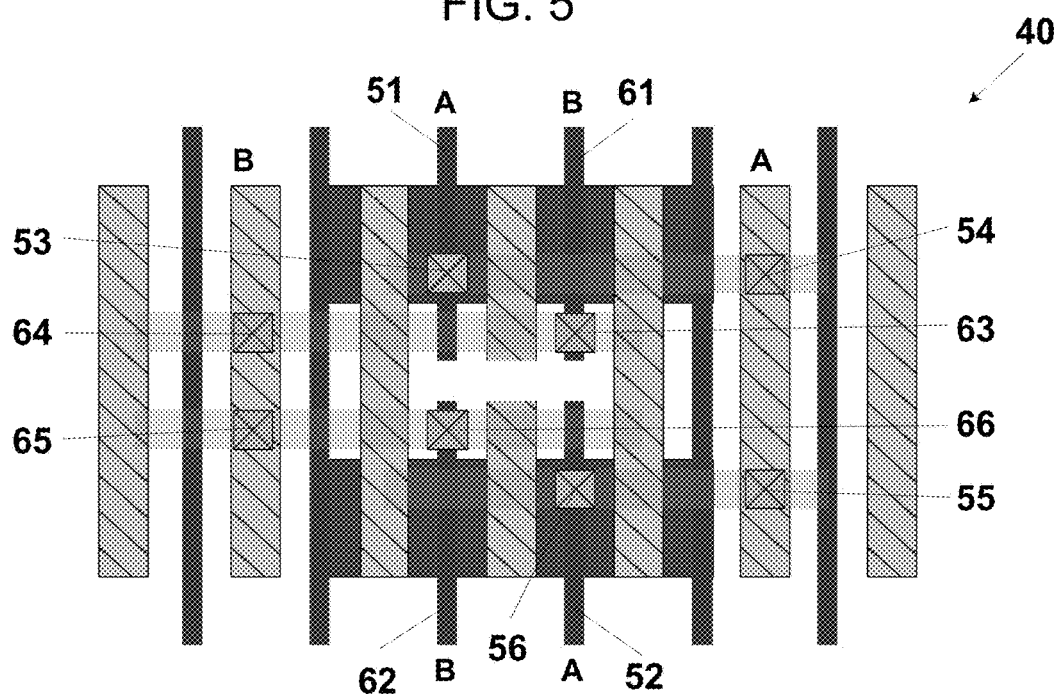

FIG. 4 is a schematic drawing of an example of a semiconductor device layout for the transmission gate circuit shown in FIG. 2 that is subject to less restrictive spacing rules. The semiconductor device is a FinFET transmission gate circuit 40 and includes a plurality of active regions 11, a plurality of gate electrodes 12, and a plurality of MD regions 13. The semiconductor device also includes metal regions 14 positioned above the active regions 11 and metal regions 15 positioned a predetermined lateral distance from the active regions 11. In the FinFET transmission gate circuit 40, the gate electrodes 12 (also labeled A) are coupled together and the gate electrodes 12 (also labeled B) are coupled together. For example, with respect to the gate electrodes A, the upper electrode A1 is coupled to the lower electrode A2 in the following manner: (1) via 41 couples electrode A to a metal region 14; (2) metal region 14 is coupled to an MD region 13 (also labeled A) by via 42; (3) MD region 13 labeled A is coupled to a metal region 14 by via 43; and (4) metal region 14 is coupled to the lower gate electrode A by via 44. A similar connection is made between gate electrodes B using vias 45, 46, 47, and 48. However, in this case, instead of using an MD region, the B electrodes are coupled together using an additional gate electrode labeled B on the right side of FIG. 4 using vias 46 and 47. The remaining vias 49-1, 49-2, and 49 correspond to the inputs and outputs 25, 26, and 27 of the transmission gate circuit described with respect to FIG. 2. For example, via 49-1 may correspond to the input 25 coupling transistors 21 and 23 together, the via 49-2 may correspond to the input 26 coupling transistors 21 and 23 together, and via 49 may correspond to the output 27 coupling transistors 21, 22, 23, and 24 together.

As illustrated by FIG. 4, there is no minimum spacing requirement between the vias and the active regions 11. Certain vias, in this case the ones for connecting gate electrodes A together, are positioned over the active regions 11. In this manner, there is additional flexibility in the design layout of the transmission gate circuit 40 because each gate electrode 12 has more possible locations for where a via can be located on each gate electrode (e.g., 7 (14, 15) instead of just 3 (15 only)). In certain embodiments, the added number of locations may provide additional flexibility in the design of semiconductor device layouts.

Figure 7:
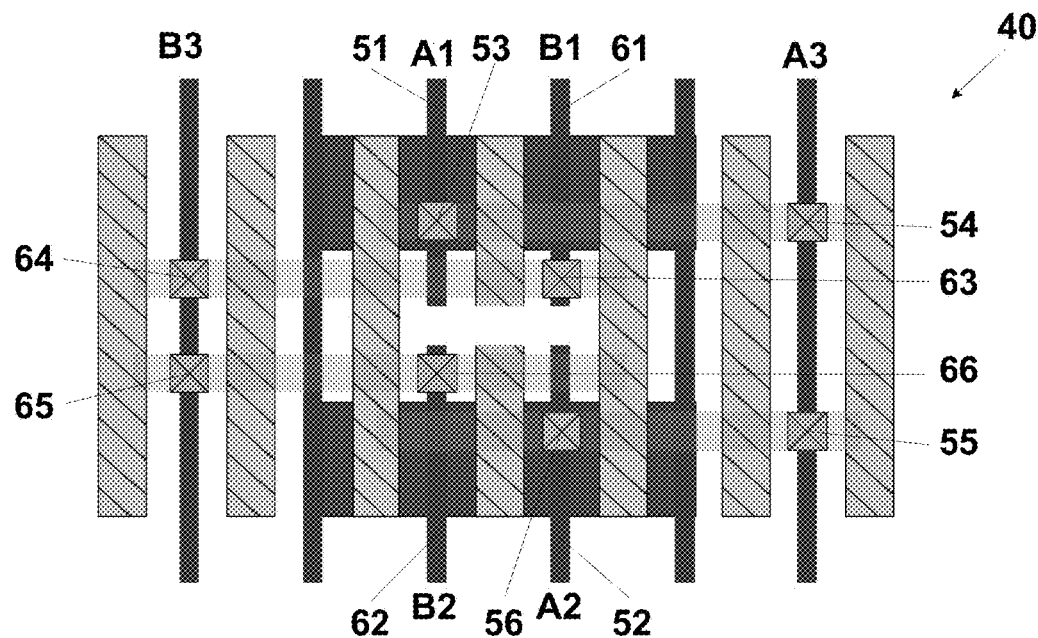
Figure 8:
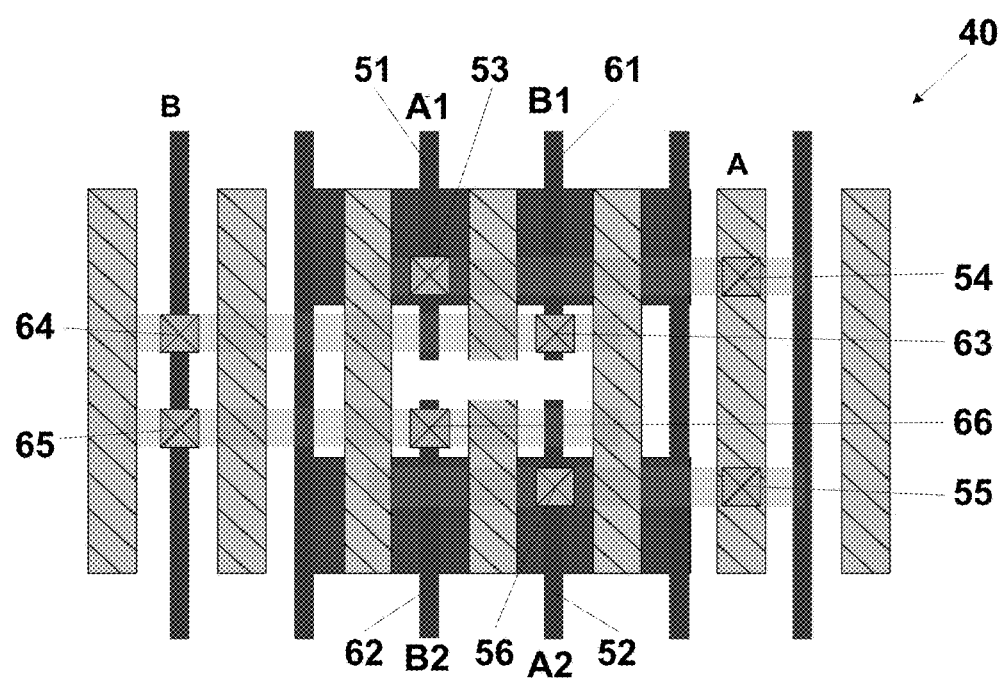
Figure 9:
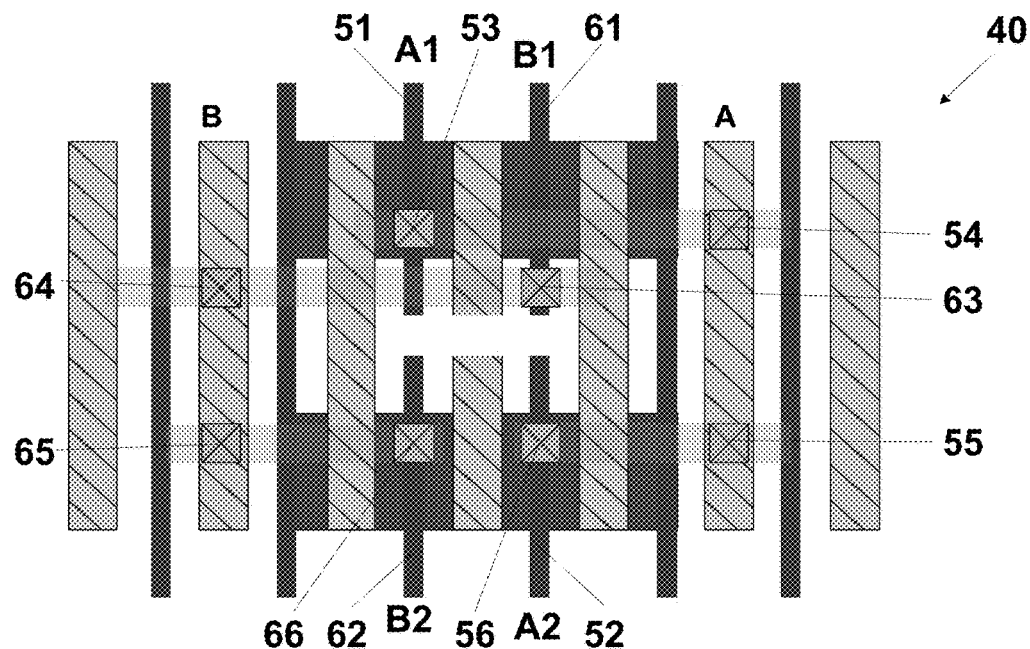
Figure 10:
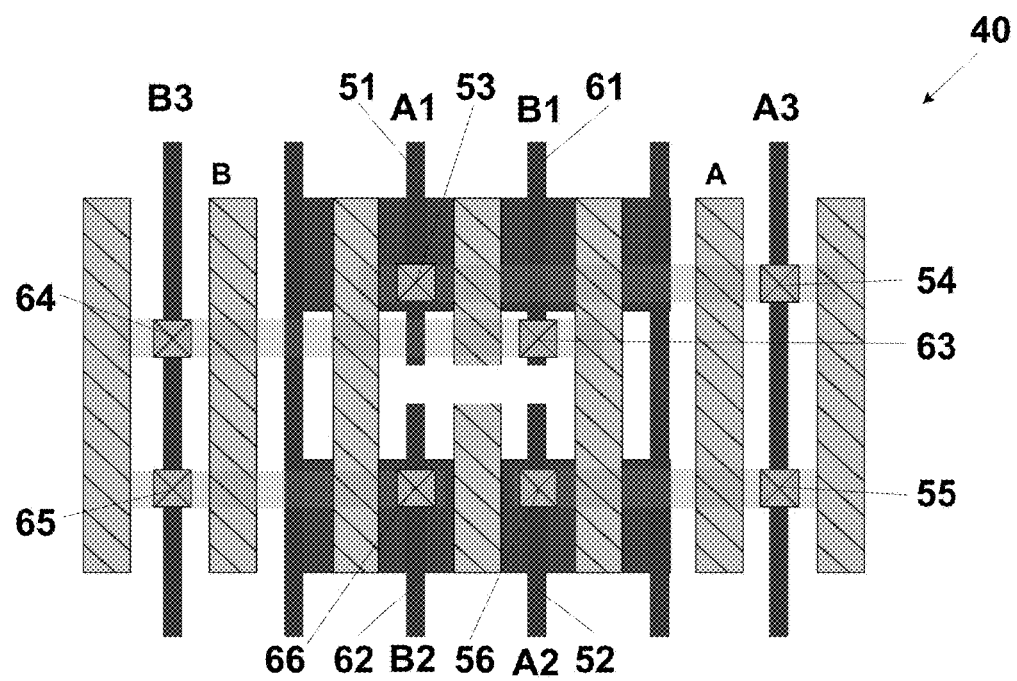
Figure 11:
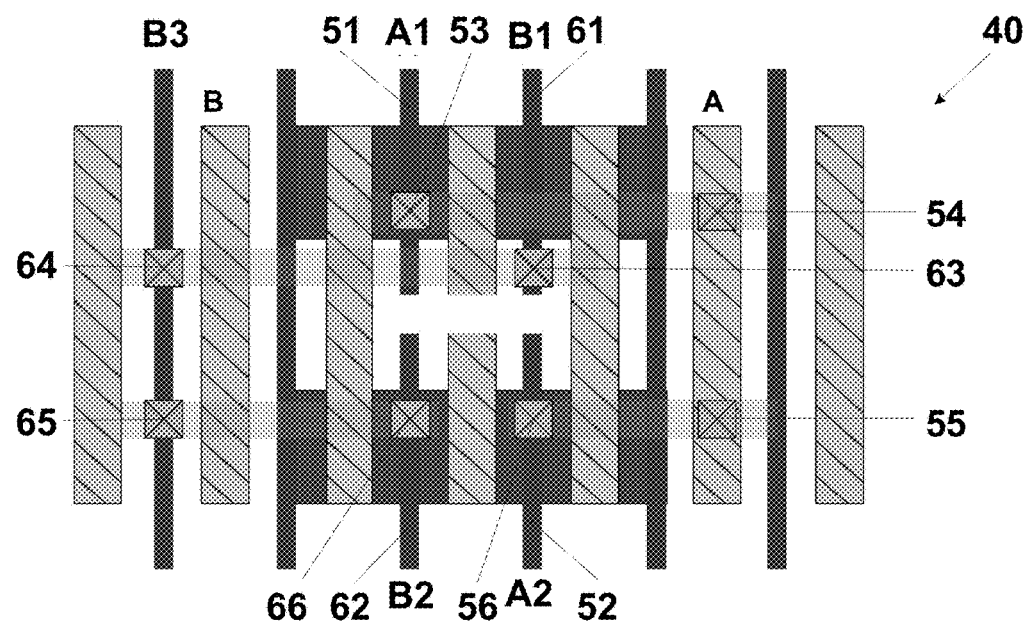
Figure 12:
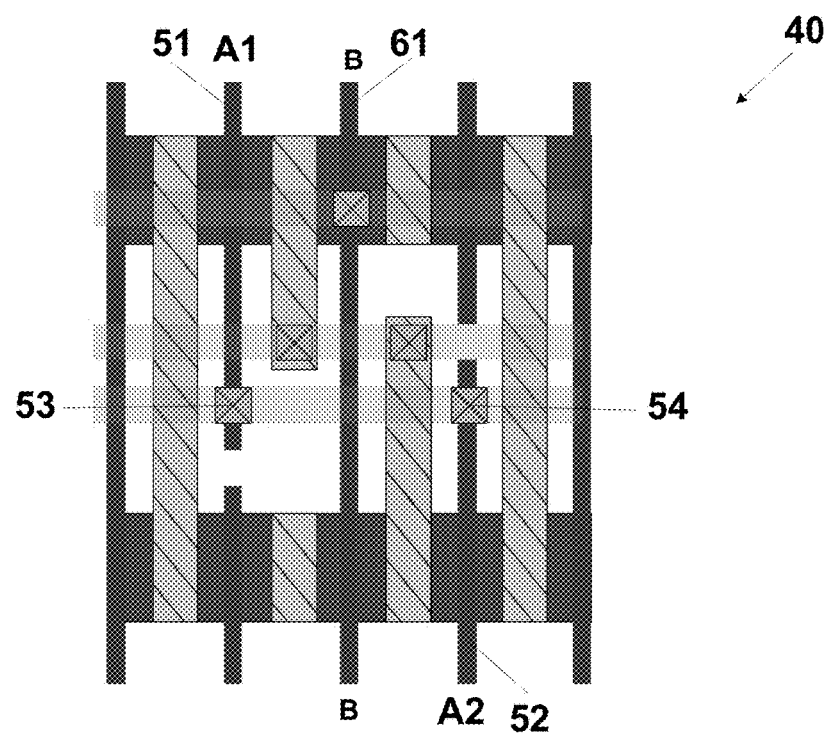
Figure 13:
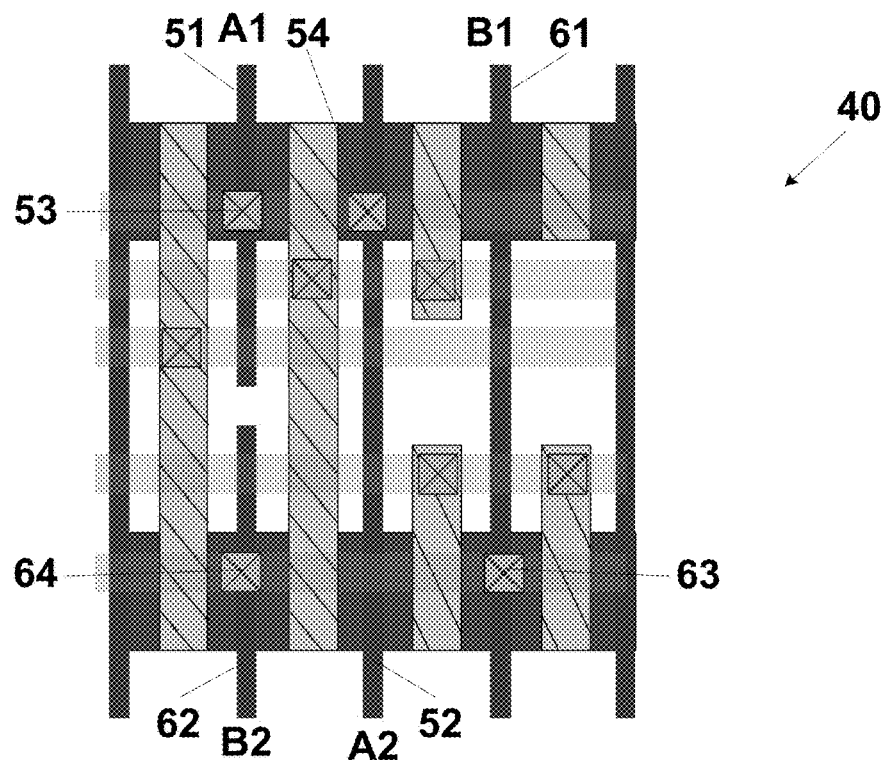
Figure 14:
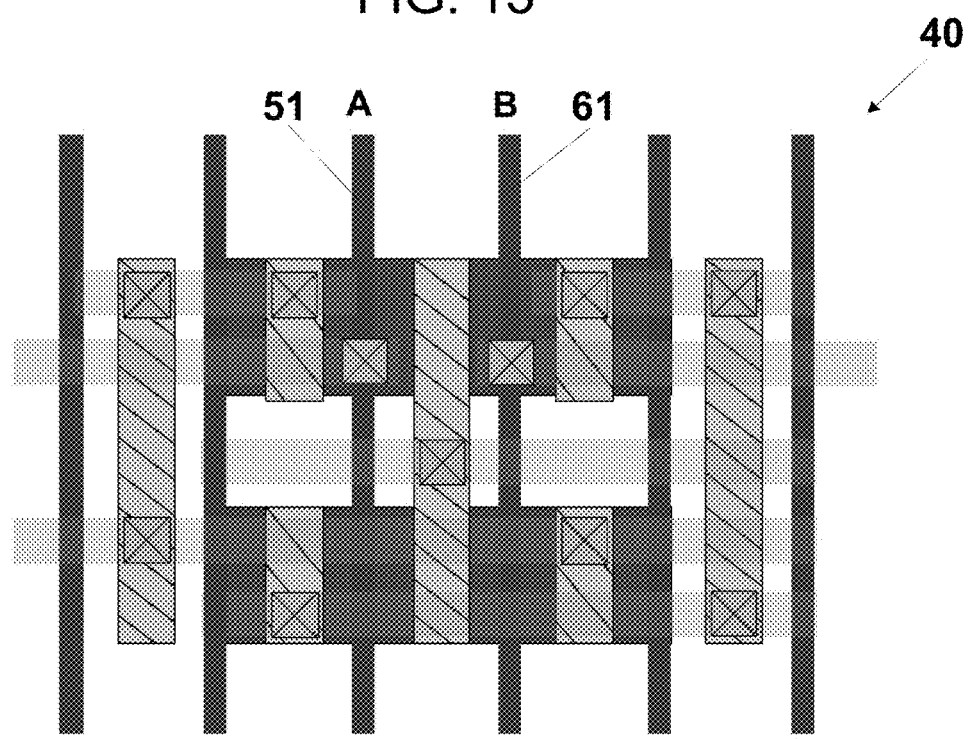

FIGS. 5-14 are schematic drawings of other examples of semiconductor device layouts for the transmission gate circuit shown in FIG. 2 that are subject to less restrictive spacing rules. Each of these figures similarly illustrates a transmission gate circuit 40 in which the layout rules do not require a minimum via-to-active-region lateral spacing. In each of these drawings, gate electrodes A (51, 52) are coupled together using vias 53, 54, 55, and 56 or a subset of these in combination with additional gate electrodes 12, MD regions 13, and/or metal regions 14, 15. Similarly, gate electrodes B (61, 62) are coupled together using vias 63, 64, 65, 66 or a subset of these in combination with additional gate electrodes 12, MD regions 13, and/or metal regions 14, 15. These exemplary circuits are also transmission gate circuits used to implement an XOR operation. The differences between the various embodiments illustrated in these figures include which combination of MD regions and gate electrodes are utilized. For example, in FIG. 5, gate electrodes labeled B are connected together using another gate electrode (also labeled B). However, in FIG. 6, they are connected together using and MD region (also labeled B). In FIG. 7, gate electrodes labeled A1, A2 and B1, B2 are connected together using another gate electrode A3 or B3. In FIG. 8, gate electrodes labeled A1, A2 are connected together using an MD region (labeled A) and gate electrodes labeled B1, B2 are connected together using a gate electrode (labeled B). In FIG. 9, gate electrodes labeled A1, A2 are connected together using and MD region (labeled A) and gate electrodes labeled B1, B2 are connected together using another MD region (labeled B). In FIG. 10, gate electrodes labeled A1, A2 are connected together using a gate electrode A3 and gate electrodes labeled B1, B2 are connected together using another gate electrode B3. In FIG. 11, gate electrodes labeled A1, A2 are connected together using and MD region (labeled A) and gate electrodes labeled B1, B2 are connected together using a gate electrode B3. In FIG. 12, gate electrodes labeled A1, A2 are directly connected together using vias 53 and 54 and gate electrode labeled B is commonly shared. In FIG. 13, gate electrodes labeled A1, A2 are directly connected together using vias 53 and 54 and gate electrodes labeled B1, B2 are directly connected together using vias 63 and 64. In FIG. 14, gate electrodes labeled A are commonly shared and gate electrode labeled B are commonly shared.

Figure 15:
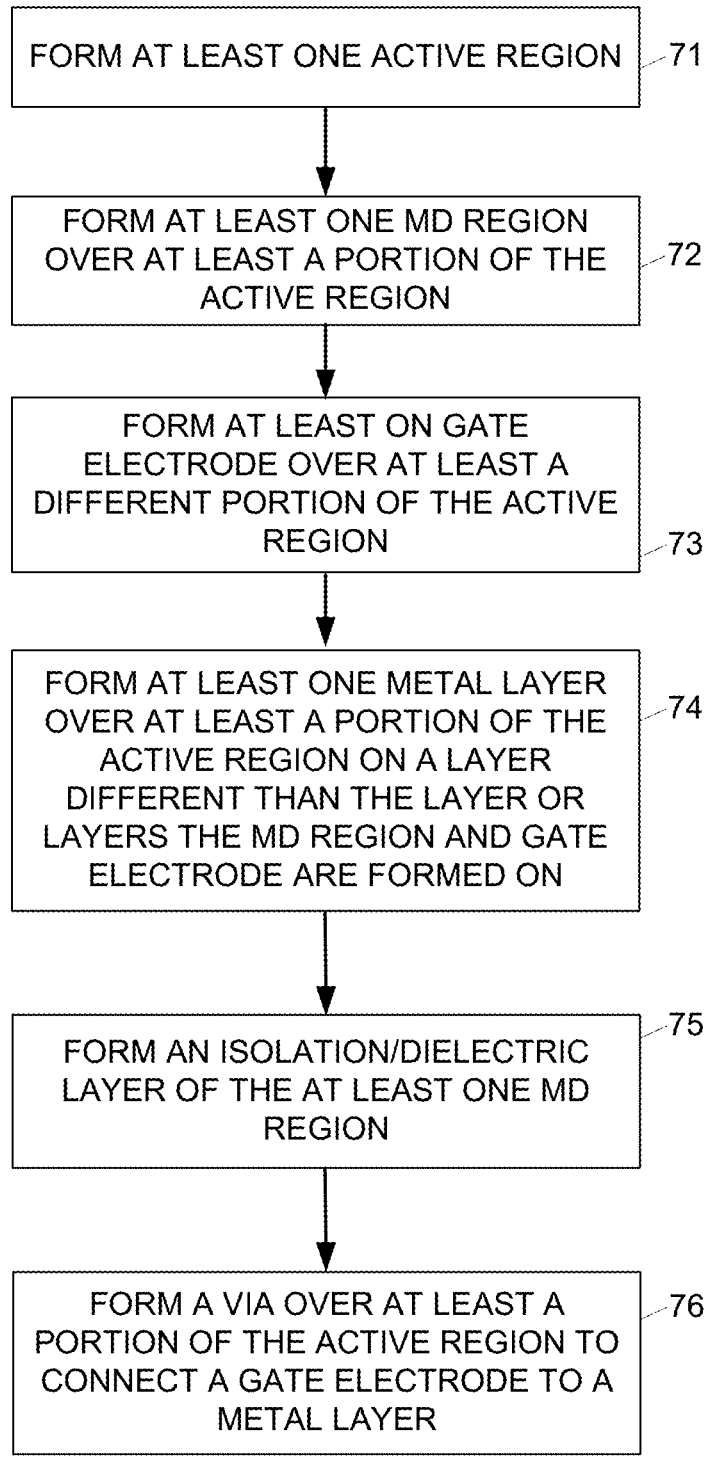
FIG. 15 is a flow chart of a method that may be implemented to manufacture an example of a semiconductor device described herein, in accordance with some embodiments.

FIG. 15 is a flow chart of a method that may be implemented to manufacture an example of a semiconductor device described herein. To aide with understanding the process, reference is also may to FIG. 4 but it should be understood that the process is not limited to any specific semiconductor device layout described herein. In the method, at least one active region 11 is formed as part of a semiconductor device during operation 71. Over at least a portion of the active region 11, at least one MD region 13 is formed at operation 72 and at least one gate electrode 12 is formed at operation 73. The gate electrodes 12 are formed in a spaced relation relative to the MD regions 13. Next, at least one metal layer 14 is formed over at least a portion of the active region in operation 74. The metal layer 14 may be formed on a layer different than the layer or layers the MD region 13 and gate electrode 12 are formed on and the metal layer 14 may be configured such that the metal layer 14 can be used to connect gate electrodes 12 and MD regions 13 to other gate electrodes 12 and other MD regions 13. For example, the metal layers 14 may be configured to traverse the FinFET transmission gate circuit 40 in a direction substantially perpendicular to the direction in which the gate electrodes 12 and MD regions 13 traverse the FinFET transmission gate circuit 40. An isolation/dielectric layer may be formed over the at least one MD layer in operation 75. A via is formed over the active region to connect a gate electrode to a metal layer in operation 76. As discussed above, the via can be formed over the active region without any minimum via-to-active-region lateral spacing, at least in part, because the isolation/dielectric layer helps prevent a short between the via and the MD region.

Embodiments described herein may provide for a semiconductor device comprising at least one active region; at least one gate electrode located over a portion of the at least one active region; and a via located over the at least one active region and configured to connect one of the at least one gate electrodes to another portion of the semiconductor device. In certain embodiments, the semiconductor device may further comprise at least one metal layer over at least a portion of the at least one active region. The at least one metal layer may be located on a layer of the semiconductor device, different than the layer on which the at least one gate electrode is located. In certain embodiments, the via may be configured to connect the one of the at least one gate electrodes to one of the at least one metal layers. In certain embodiments, the semiconductor device may further comprise at least one MD region located over a portion of the at least one active region different than the portion of the active region where the at least one gate electrode is located. The at least one MD region may be located on a layer of the semiconductor device that is different than the layer of the semiconductor device on which the at least one metal region is located. In certain embodiments, the at least one metal layer may be configured to enable the at least one gate electrode to be connected to another at least one gate electrode and/or at least one MD region using the at least one metal layer.

Embodiments described herein may provide a semiconductor device, comprising at least one active region; at least one MD region formed over a portion of the at least one active region; and at least one gate electrode formed over a portion of the at least one active region different than the portion of the active region where the MD region is formed. The semiconductor device may further comprise at least one metal layer over at least a portion of the at least one active region, the at least one metal layer may be located on a layer of the semiconductor device, different than the layers on which the at least one MD region and at least one gate electrode are formed. A via may be formed over the at least one active region and configured to connect one of the at least one gate electrodes to one of the at least one metal layers. The at least one metal layer may be configured to enable the at least one gate electrode to be connected to another at least one electrode and/or at least one MD region.

Embodiments described herein may provide for a transmission gate circuit, comprising at least one active region; at least one MD region formed over a portion of the at least one active region; an isolation/dielectric layer formed over the at least one MD region; and at least one gate electrode formed over a portion of the at least one active region different than the portion of the active region where the MD region is formed. The transmission gate circuit may further comprise at least one metal layer over at least a portion of the at least one active region, the at least one metal layer may be located on a layer of the semiconductor device, different than the layers on which the at least one MD region and at least one gate electrode are formed. A via may be formed over the at least one active region and configured to connect one of the at least one gate electrodes to one of the at least one metal layers. The at least one metal layer may be configured to enable the at least one gate electrode to be connected to another at least one electrode and/or at least one MD region.

Embodiments described herein may provide for a method for forming a semiconductor device, the method comprising forming at least one active region; forming at least one MD region over a portion of the at least one active region; and forming at least one gate electrode over a portion of the at least one active region different than the portion of the active region where the MD region is formed. The method may further comprise forming at least one metal layer over at least a portion of the at least one active region, the at least one metal layer may be located on a layer of the semiconductor device, different than the layers on which the at least one MD region and at least one gate electrode are formed. A via may be formed over the at least one active region and configured to connect one of the at least one gate electrodes to one of the at least one metal layers. The at least one metal layer may be configured to enable the at least one gate electrode to be connected to another at least one electrode and/or at least one MD region.

In certain embodiments, the semiconductor device may be a transmission gate circuit. In certain embodiments, the semiconductor device may perform an XOR logical operation. In certain embodiments, the device may further comprise an isolation/dielectric layer formed over the at least one MD region. In certain embodiments, the at least one metal layer may be more freely utilized during layout design as a result of not requiring a minimum via-to-active-region lateral spacing. In certain embodiments, there may be approximately 20%, 40% or 60% more options for locating vias within the semiconductor device.

In certain embodiments, the semiconductor devices described herein may be formed from semiconductor layouts. In certain embodiments, the semiconductor layout may comprise the structures described herein and/or be a set of instructions for forming the various structures described herein. In certain embodiments, the instructions may be a program stored in a non-transitory computer readable recording medium. Some examples of a non-transitory computer readable recording medium include, but are not limited to, external/removable and/or internal/built-in storage or memory units, e.g., one or more of an optical disk, such as a DVD, a magnetic disk, such as a hard disk, a semiconductor memory, such as a ROM, a RAM, a memory card, and the like.

The components and procedures described above provide examples of elements recited in the claims. They also provide examples of how a person of ordinary skill in the art can make and use the claimed invention. They are described here to provide enablement and best mode without imposing limitations that are not recited in the claims.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:
   at least one active region;
   at least one gate electrode located over a portion of the at least one active region;
   a via located over the at least one active region and configured to connect one of the at least one gate electrodes to another portion of the semiconductor device.

2. The semiconductor device of claim 1, further comprising at least one metal layer over at least a portion of the at least one active region, the at least one metal layer being located on a layer of the semiconductor device, different than the layer on which the at least one gate electrode is located.

3. The semiconductor device of claim 2, wherein the via is configured to connect the one of the at least one gate electrodes to one of the at least one metal layers.

4. The semiconductor device of claim 3, wherein the at least one metal layer is located over an active region.

5. The semiconductor device of claim 2, further comprising at least one metal over oxide (MD) region located over a portion of the at least one active region different than the portion of the active region where the at least one gate electrode is located, the at least one MD region being located on a layer of the semiconductor device that is different than the layer of the semiconductor device on which the at least one metal region is located.

6. The semiconductor device of claim 5, wherein the at least one metal layer is configured to enable the at least one gate electrode to be connected to another at least one gate electrode and/or at least one MD region using the at least one metal layer.

7. The semiconductor device of claim 5, further comprising an isolation layer formed over the at least one MD region.

8. The semiconductor device of claim 1, wherein the semiconductor device is a transmission gate circuit.

9. The semiconductor device of claim 1 wherein the semiconductor device performs an XOR logical operation.

10. The semiconductor device of claim 1, wherein the same gate electrode can have vias located at positions over an active region and at positions not associated with an active region.

11. The semiconductor device of claim 1, further comprising an metal over oxide (MD) region, wherein the same MD region can have vias located at positions over an active region and at positions not associated with an active region.

12. A method for forming a semiconductor device, the method comprising:
forming at least one active region;
forming at least one metal over oxide (MD) region over a portion of the at least one active region;
forming at least one gate electrode over a portion of the at least one active region different than the portion of the active region where the MD region is formed;
forming at least one metal layer over at least a portion of the at least one active region, the at least one metal layer being located on a layer of the semiconductor device, different than the layers on which the at least one MD region and at least one gate electrode are formed;
forming a via over the at least one active region and configured to connect one of the at least one gate electrodes to one of the at least one metal layers;
wherein the at least one metal layer is configured to enable the at least one gate electrode to be connected to another at least one electrode and/or at least one MD region.

13. The method of claim 12, wherein the semiconductor device is a transmission gate circuit.

14. The method of claim 12, wherein the semiconductor device performs an XOR logical operation.

15. The method of claim 12, further comprising forming an isolation layer over the at least one MD region.

16. The method of claim 12, wherein the same MD region can have vias located at positions over an active region and at positions not associated with an active region.

17. The method of claim 12, wherein the same gate electrode can have vias located at positions over an active region and at positions not associated with an active region.

18. The method of claim 12, wherein more options for locating vias within the semiconductor device are provided because an isolation layer over the at least one MD region is provided in the at least one active region.

19. A transmission gate circuit, comprising:
at least one active region;
at least one metal over oxide (MD) region formed over a portion of the at least one active region;
an isolation/dielectric layer formed over the at least one MD region;
at least one gate electrode formed over a portion of the at least one active region different than the portion of the active region where the MD region is formed;
at least one metal layer over at least a portion of the at least one active region, the at least one metal layer being located on a layer of the semiconductor device, different than the layers on which the at least one MD region and at least one gate electrode are formed;
a via formed over the at least one active region and configured to connect one of the at least one gate electrodes to one of the at least one metal layers;
wherein the at least one metal layer is configured to enable the at least one gate electrode to be connected to another at least one electrode and/or at least one MD region.

20. The transmission gate circuit of claim 19, wherein the semiconductor device performs an XOR logical operation.

* * * * *